(12) United States Patent
Hu

(10) Patent No.: US 10,964,580 B2
(45) Date of Patent: Mar. 30, 2021

(54) WAFER RECONFIGURATION DURING A COATING PROCESS OR AN ELECTRIC PLATING PROCESS

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 244 days.

(21) Appl. No.: 15/374,622

(22) Filed: Dec. 9, 2016

(65) Prior Publication Data

US 2017/0092526 A1    Mar. 30, 2017

Related U.S. Application Data

(63) Continuation of application No. 14/604,883, filed on Jan. 26, 2015, now Pat. No. 9,545,776.

(51) Int. Cl.
*B32B 3/02* (2006.01)
*B32B 9/00* (2006.01)
(Continued)

(52) U.S. Cl.
CPC ............ *H01L 21/6835* (2013.01); *B32B 3/02* (2013.01); *B32B 3/30* (2013.01); *B32B 9/00* (2013.01); *B32B 9/04* (2013.01); *B32B 15/012* (2013.01); *B32B 15/018* (2013.01); *B32B 15/04* (2013.01); *B32B 15/18* (2013.01); *B32B 15/20* (2013.01); *B32B 17/06* (2013.01); *B32B 17/061* (2013.01); *B32B 2250/02* (2013.01); *B32B 2255/00* (2013.01); *B32B 2255/06* (2013.01); *B32B 2255/26* (2013.01); *B32B 2457/08* (2013.01); *B32B 2457/14* (2013.01); *G03F 7/2028* (2013.01); *H01L 21/0271* (2013.01);
(Continued)

(58) Field of Classification Search
CPC ............ G03F 7/2028; H01L 21/68721; H01L 21/68735; H01L 21/68771; H01L 2221/6834; H01L 21/6835; H01L 21/6836; H01L 21/68707; H01L 21/02282; H01L 21/288; H01L 2224/27416; B32B 2457/14; B32B 7/14
See application file for complete search history.

(56) References Cited

U.S. PATENT DOCUMENTS 4,921,564 A * 5/1990 Moore ............. H01L 21/67132
156/701
6,001,183 A 12/1999 Gurary et al.
(Continued)

OTHER PUBLICATIONS

Xiao (Introduction to Semiconductor Manufacturing Technology, Ch. 6-Photolithography). (Year: 2012).*
(Continued)

*Primary Examiner* — Alicia J Sawdon
(74) *Attorney, Agent, or Firm* — JCIPRNET

(57) ABSTRACT

At least one wafer is embedded in a carrier to eliminate or at least reduce edge effect. The wafer reconfiguration is designed to improve a quality not only for spin coating process but also for electric plating process. An edge bead is formed on top of the carrier instead of being formed on top of the wafer so that a full top surface of the wafer can be active to the fabrication of chips and therefore more chips are yielded for a single wafer. The backside of the wafer is not contaminated by the coating according to the present invention. Further, dummy circuits can be made on top of the carrier so that electric plating uniformity for full area of a wafer can be improved.

17 Claims, 13 Drawing Sheets

(51) Int. Cl.
   *H01L 21/02*      (2006.01)
   *H01L 21/683*     (2006.01)
   *B32B 9/04*       (2006.01)
   *B32B 15/04*      (2006.01)
   *B32B 17/06*      (2006.01)
   *B32B 3/30*       (2006.01)
   *B32B 15/01*      (2006.01)
   *B32B 15/18*      (2006.01)
   *B32B 15/20*      (2006.01)
   *G03F 7/20*       (2006.01)
   *H01L 21/027*     (2006.01)
   *H01L 21/288*     (2006.01)

(52) U.S. Cl.
   CPC ...... *H01L 21/02282* (2013.01); *H01L 21/288* (2013.01); *H01L 2224/27416* (2013.01)

(56) References Cited

U.S. PATENT DOCUMENTS

| | | | |
|---|---|---|---|
| 6,093,631 A * | 7/2000 | Jaso | H01L 21/3212 257/E21.304 |
| 6,343,784 B1 * | 2/2002 | Jourde | H01L 21/68721 269/287 |
| 8,192,555 B2 | 6/2012 | Benson | |
| 8,912,075 B1 | 12/2014 | Lei et al. | |
| 2002/0162630 A1 * | 11/2002 | Satoh | C23C 16/4583 156/345.51 |
| 2006/0219351 A1 * | 10/2006 | Kuan | H01L 21/67132 156/247 |
| 2006/0286910 A1 | 12/2006 | Voigt et al. | |
| 2007/0241078 A1 | 10/2007 | Pratt et al. | |
| 2013/0048224 A1 * | 2/2013 | George | H01L 21/67282 156/752 |
| 2013/0224952 A1 * | 8/2013 | Chang | H01L 29/7847 438/682 |

OTHER PUBLICATIONS

National Electronic Alloys Inc., Alloy 42 & ASMT F30. (Year: 2011).*
Twix.com, Mars Inc., 2014.
National Electronic Alloys in., Alloy 42 and ASMT F30, 2011.
Hong Xiao, Introduction to Semiconductor Manufacturing Technology, Second Edition, SPIE Press, 2012. Chapter 6 Photolithography.

* cited by examiner

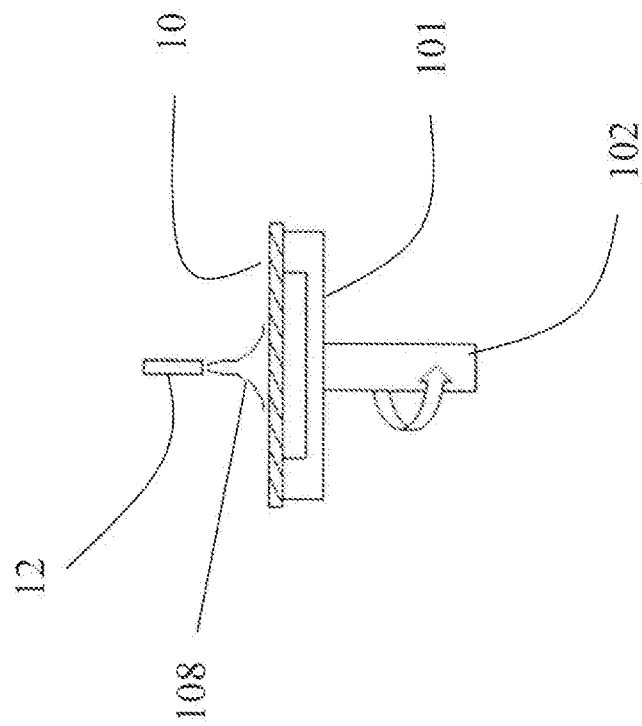

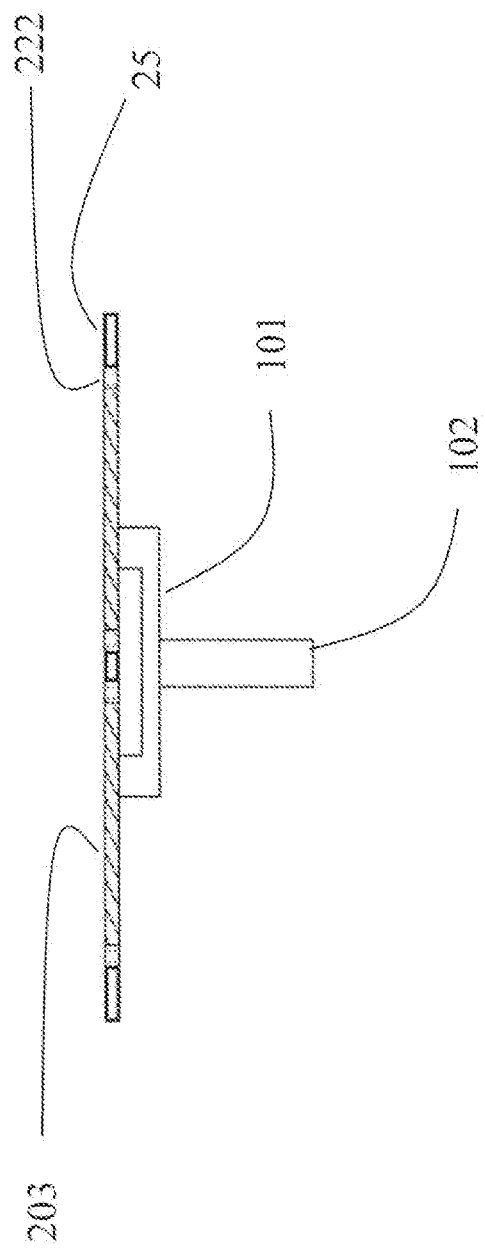

WAFER RECONFIGURATION DURING A COATING PROCESS OR AN ELECTRIC PLATING PROCESS

RELATED APPLICATION

This application is a continuation application of U.S. application Ser. No. 14/604,883 filed Jan. 26, 2015 the disclosure of which is incorporated by reference herein in its entirety.

BACKGROUND

Technical Field

The present invention relates to wafer reconfiguration, especially for a wafer embedded in a carrier to eliminate or at least reduce edge effect to provide improvement not only for spin coating process but also for electric plating process.

Description of Related Art

FIGS. 1, 2A~2B show a prior art

FIG. 1 shows that U.S. Pat. No. 8,192,555 discloses a spin coating process for spreading photoresist onto silicon wafers. FIG. 1 shows that a photoresist dispenser 12 is configured on top; photoresist 108 is dispensed on a top surface of a wafer 10. The wafer 10 is mounted on a vacuum chuck 101. A spindle 102 is configured on bottom of the vacuum chuck 101 to spin the wafer 10 during spin coating process.

FIG. 2A shows that the spin coating procedure makes an edge bead 107 be formed on top at the peripheral of the wafer 10. Further, the photoresist 108 quite often wraps around the wafer 108 contaminating the backside 1072 of the wafer 108 as well.

FIG. 2B shows that the edge bead 107 is then removed in a later process. A circular peripheral area 105 of the wafer 10 is exposed. The Edge Bead Removal (EBR) process leaves uniform thickness of photoresist coating across the wafer 10 except for the circular peripheral area 105. The uniform photoresist coating allows for proper focus of light onto the coated wafer during a photolithography process to design the microelectronic circuits. However, the edge bead removal (EBR) reduces the active area of a wafer and hence reduces chip yields. FIG. 2B shows that an active area 106 smaller than a full top surface of the wafer 10 can be used for the fabrication of chips. FIG. 2B shows the backside photoresist contamination of the wafer 10 has been removed also. The backside photoresist removal takes additional time and cost.

BRIEF DESCRIPTION OF THE DRAWINGS

FIGS. 1, 2A~2B show a prior art.

FIGS. 4A~4B, 5A~5B, 6A~6B, 7~10 show a process for preparing a wafer reconfiguration of FIG. 3A.

DETAILED DESCRIPTION

A wafer reconfiguration is disclosed to improve quality not only for spin coating process but also for electric plating process. The wafer reconfiguration shows that at least one wafer is embedded in a carrier. Such a wafer reconfiguration facilitates edge bead be formed on top of the carrier instead of being formed on top of the wafer during spin coating process. Further, dummy circuits can be made on top of the carrier to improve uniformity of plating thickness during plating process.

According to the present invention, a carrier is prepared with at least one through space for a wafer to be embedded in. Sealing material fills into the gap between the wafer and the carrier. The sealing material bridges the top surface of the carrier and the top surface of the wafer so that the photoresist spreads over the top surface of the wafer and extends to the top surface of the carrier to leave a circular edge bead on top of the carrier.

Since the edge bead locates on top of the carrier, a later removal of the edge bead shall reduce damage to the wafer and still keep a full top surface of the wafer to be active so that full area of the wafer can be used to the fabrication of chips and hence to increase the chip yield.

Figure 3A:
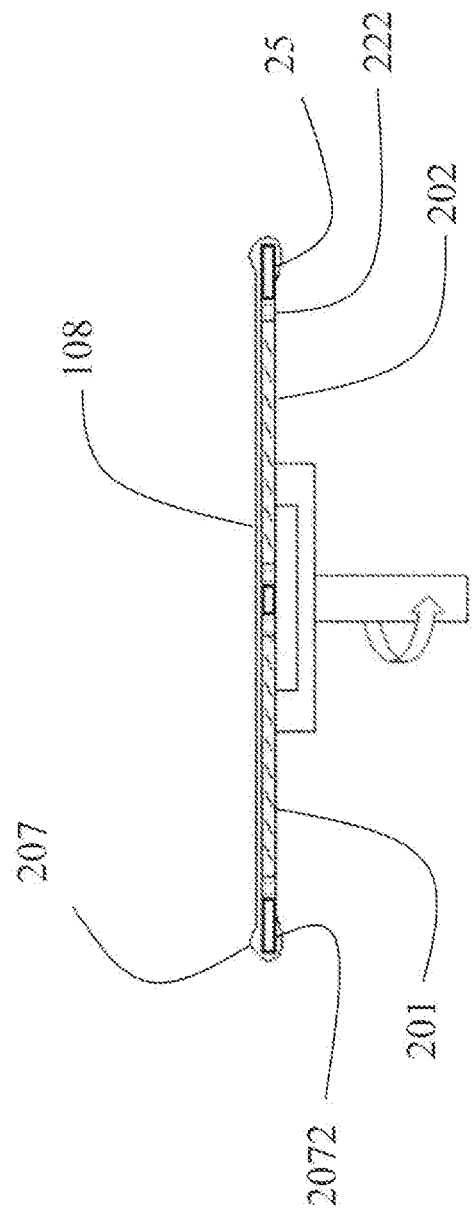
FIGS. 3A~3B show a first embodiment according to the present invention.
Figure 3B:
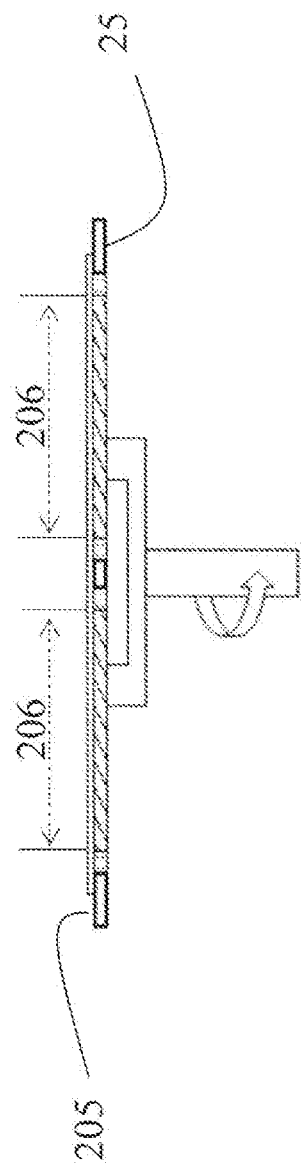

FIGS. 3A~3B show a first embodiment according to the present invention

FIG. 3A shows a wafer reconfiguration for two wafers embedded in a carrier in a section view.

Figures 2A, 2B:
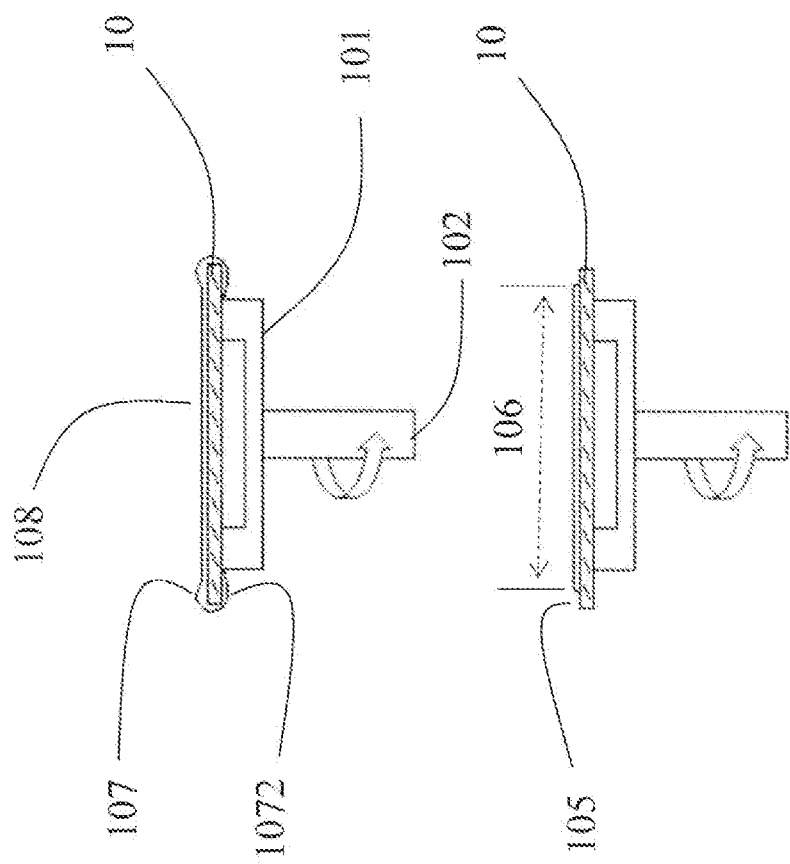

A carrier 25 has two through spaces; each space accommodates one of the wafer 201, 202. A thickness of the carrier 25 equals to or closes to the thickness of the wafer 201, 202. Sealing material 222 fills in a gap 22 between each wafer 201, 202 and the carrier 25. The sealing material 222 bridges a top surface of the carrier 25 and a top surface of the wafer 201, 202. A photoresist 108 is coated on top of the wafer 201, 202 and on top of the carrier 25 through spin coating process. FIG. 3A shows that a uniform thickness of the photoresist 108 covers a top of both wafers 201, 202. The photoresist 108 also covers most top of the carrier 25. An edge bead 207 is formed on top of the carrier 25 in a circular peripheral area. Please pay attention that the edge bead 207 is formed on an area outside a top of both wafers 201, 202 from a top view. In other words, the circular edge bead 207 is formed surrounding both wafers 201, 202 from a top view. Since uniform thickness photoresist 108 formed on top of the full top surface of both wafers 201, 202 so that the full top surface of both wafers 201, 202 can be used to the fabrication of chips. The full top surface of each wafer 201,202 is a full active area 206 which can be used for the fabrication of chips. The active area 206 for the present invention is larger than the active area 106 of the prior art FIG. 2B, therefore the present invention yield more chips than the conventional one while under same process conditions.

Further, the photoresist wraps around the carrier 25, if any, contaminating the backside 2072 of the carrier 25 only, instead of contaminating the backside of the wafer 201, 202.

FIG. 3B shows that the circular edge bead 207 is removed in a later step while leaving a central area with a uniform thickness of the photoresist 108 on top of both wafers 201, 202. The EBR process leaves a circular area 205 on top of the carrier 25 without having photoresist 108. The circular area 205 surrounds the wafers 201, 202. Each of the wafers 201, 202 has an active area 206 according to the present invention. In other words, the full surface of the wafer 201, 202 can be used to the fabrication of chips.

Figure 4A:
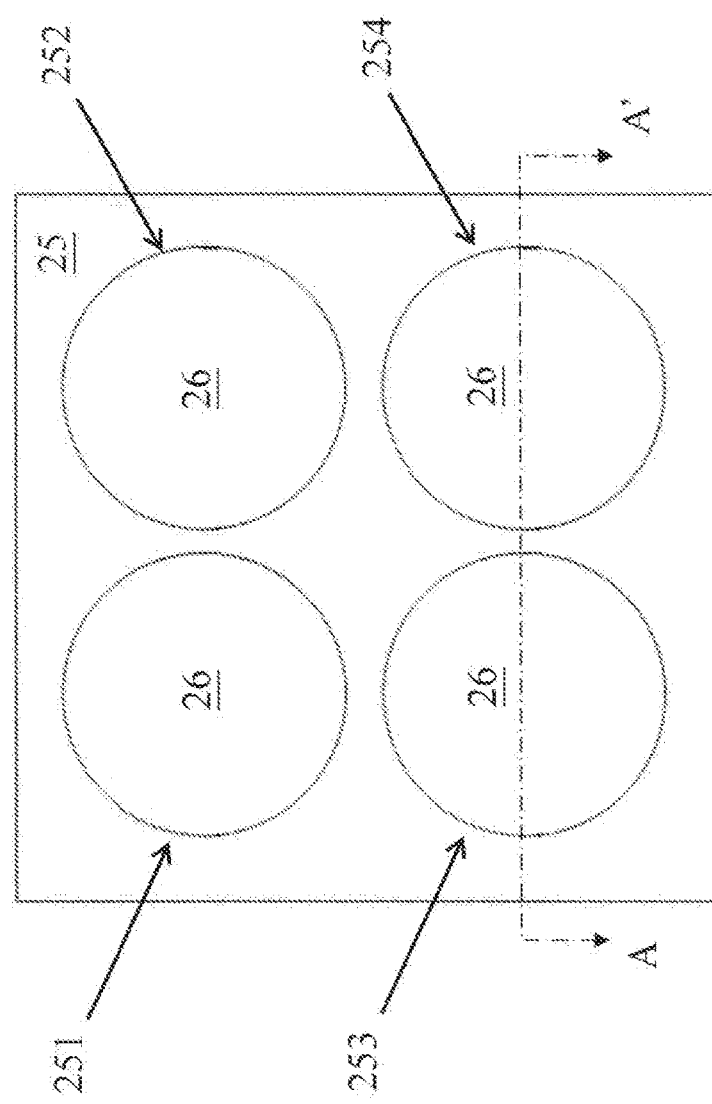

FIGS. 4A~4B, 5A~5B, 6A~6B, 7~10 show a process for preparing a wafer reconfiguration of FIG. 3A FIG. 4A shows a carrier 25 having four through spaces 251, 252, 253, 254 formed therein; each space is designed to accommodate a wafer for process. A tape 26 is configured on bottom of the carrier 25 for sealing the through spaces 251, 252, 253, 254 from bottom.

Figure 4B:
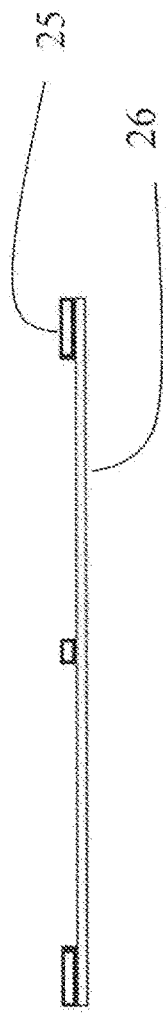

FIG. 4B shows a section view of FIG. 4A according to line AA'. FIG. 4B shows that a tape 26 is configured on bottom of the carrier 25.

Figure 5A:
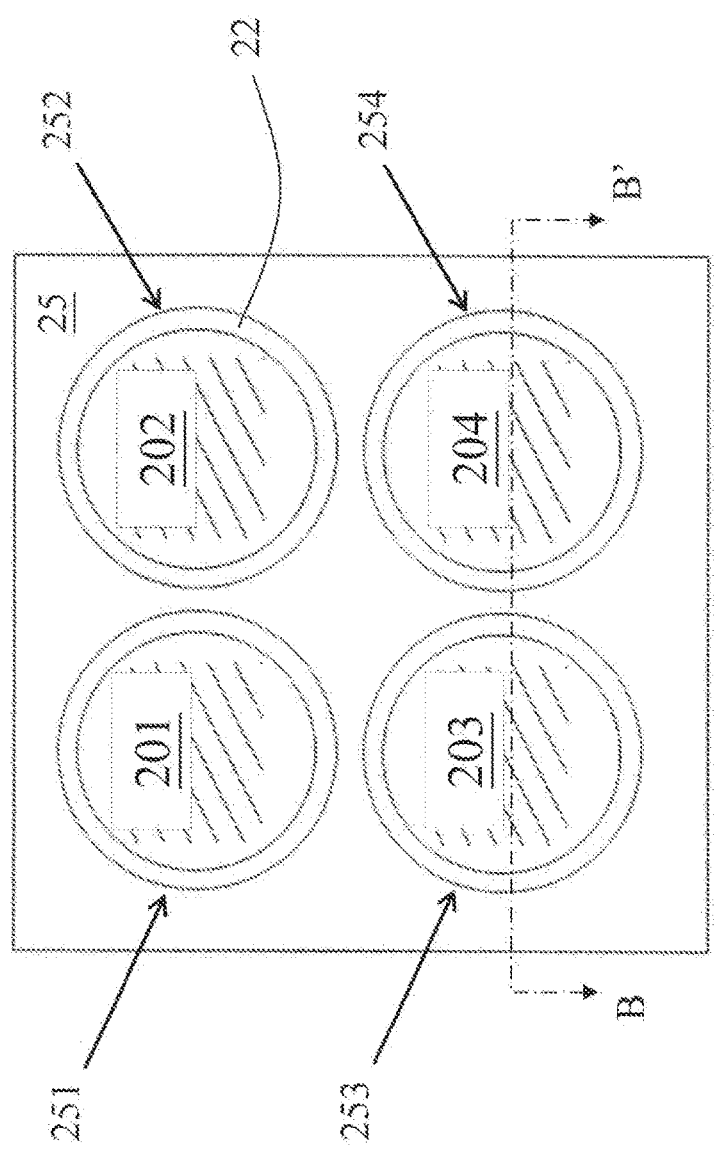

FIG. 5A shows that four wafers 201~204, each is configured in one of the spaces 251~254. A gap 22 is formed between each wafer 201~204 and the carrier 25.

Figure 5B:
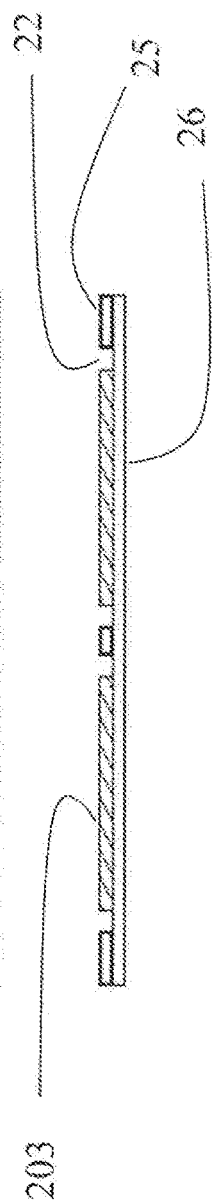

FIG. 5B shows a section view of FIG. 5A according to line BB'. FIG. 5B shows that a gap 22 is formed between each wafer 201~204 and the carrier 25.

Figure 6A:
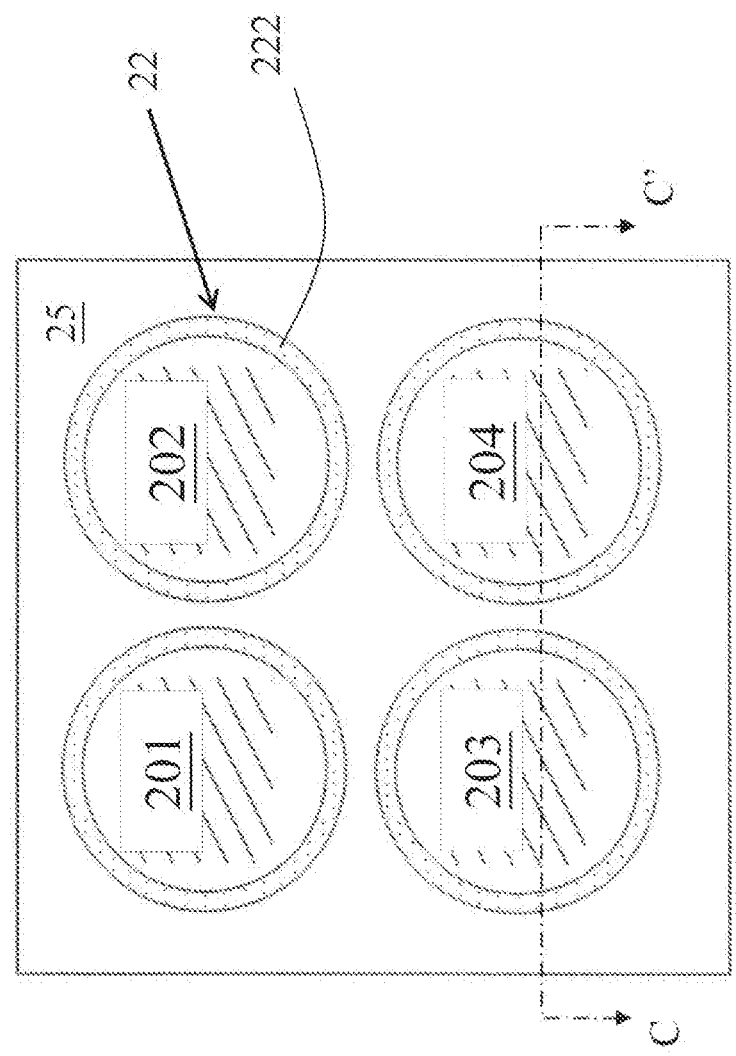

FIG. 6A shows a sealing material 222 filling in the gap 22 to bridge the top surface of the wafer 201~204 and the top surface of the carrier 25.

Figure 6B:
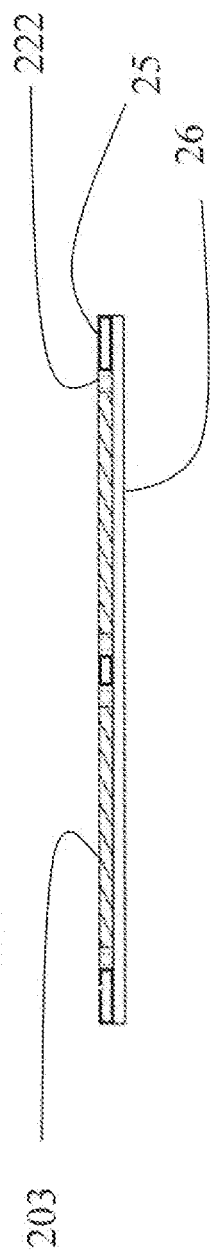

FIG. 7 shows that the tape 26 is removed from the product of FIG. 6B and then configured on top of the vacuum chuck for spin coating process.

The carrier 25, wafers 201~204, and the sealing material 222 are made coplanar.

Figure 8:
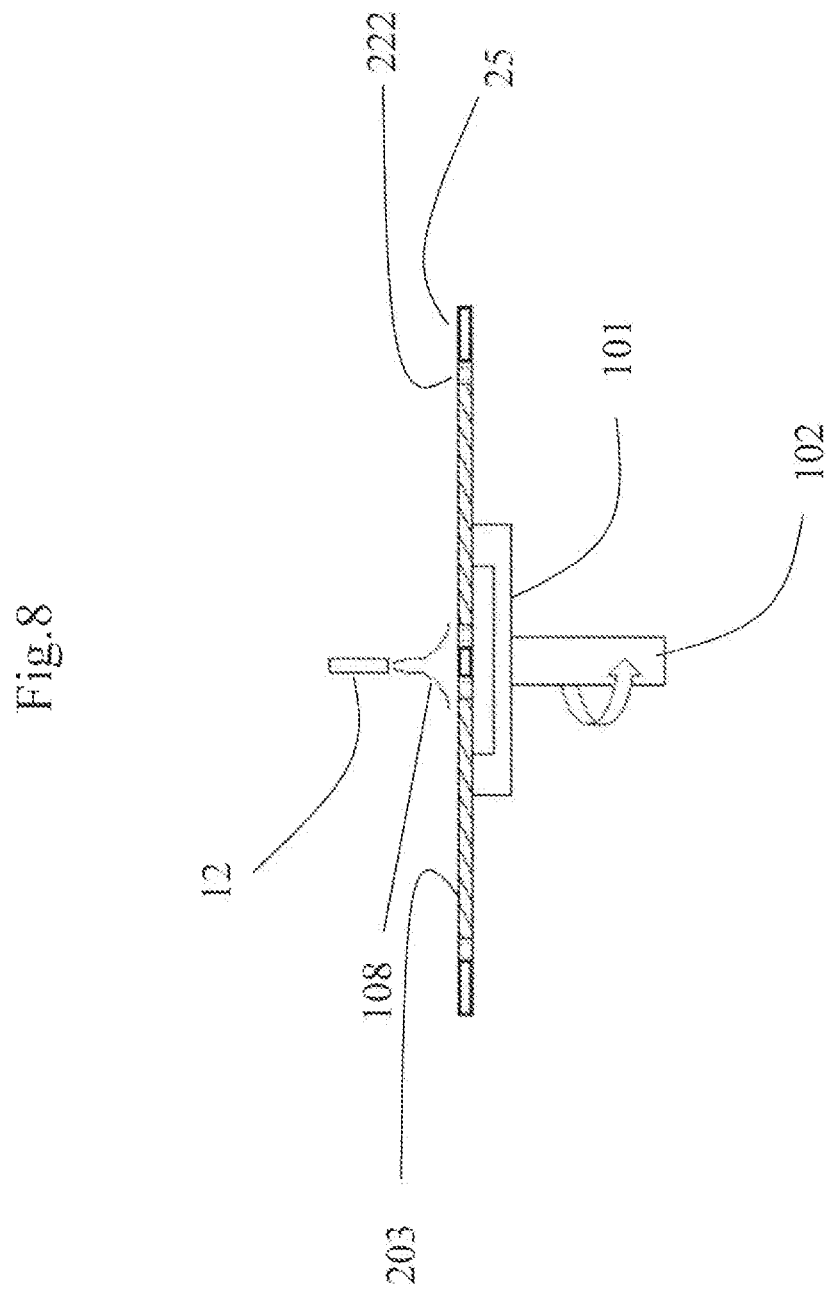

FIG. 8 shows that photoresist dispenser 12 is configured on top, and the photoresist 108 is then coated on top of the wafer 201~204 while spinning.

Figure 9:
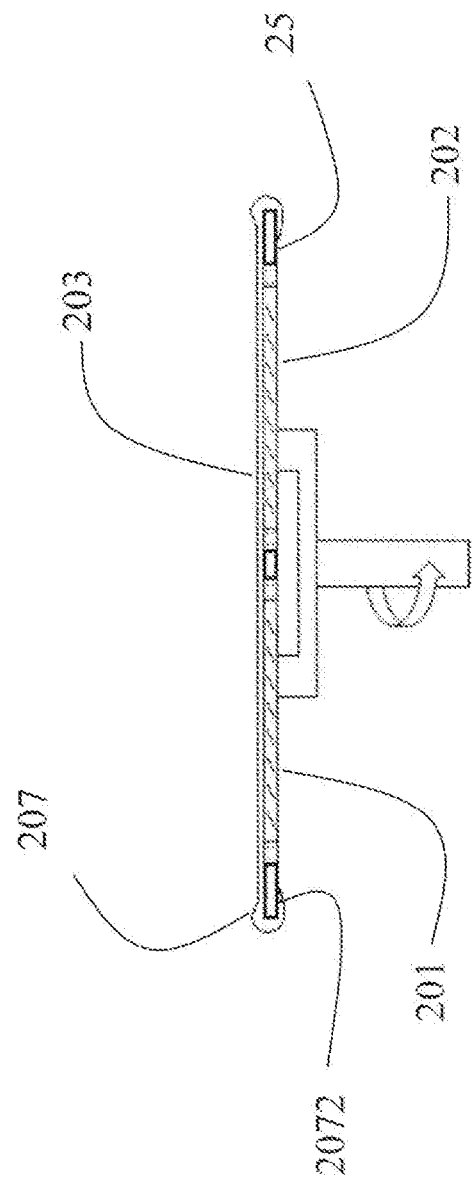

FIG. 9 shows that a circular edge bead 207, however only two edge beads are shown in the section view, is formed on top of the carrier 25 in the peripheral area. The circular edge bead 207 encircles an area on top larger than an area occupied by the four wafers 201~204 from a top view. In other words, the circular edge bead 207 locates at an area outside an area where the four wafers 201~204 occupied from a top view, so that a uniform thickness photoresist 108 covers a full top surface of the wafers 201~204. Further, the photoresist wraps around the carrier 25, if any, contaminating the backside 2072 of the carrier 25 only, instead of contaminating the backside of the wafer 201~204.

Figure 10:
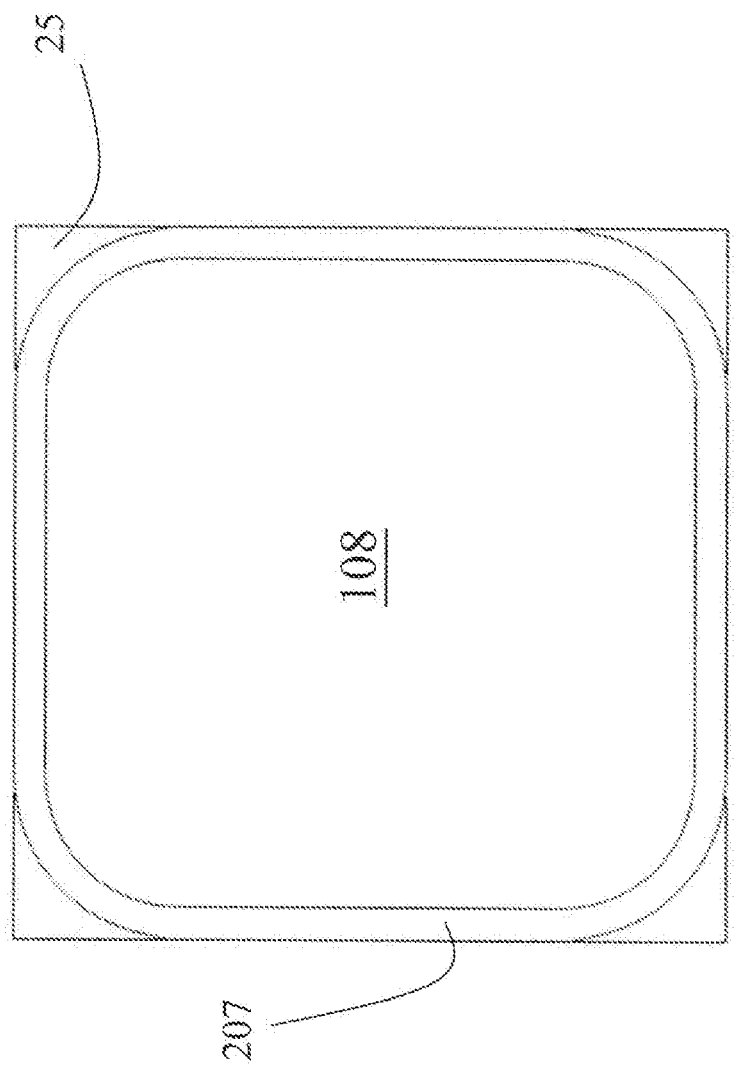

FIG. 10 shows a top view of FIG. 9.

The photoresist 108 is coated on top of the carrier 25 to cover top of the four wafers 201~204. A circular edge bead 207 configured at a peripheral of the photoresist 108. The circular edge bead 207 is configured on a top of the carrier 25. The circular edge bead 207 does not cover top of the wafers 201~204 from a top view. The flat and uniform thickness photoresist 108 covers an area larger than the full top surface of the wafers 201~204.

Figure 11:
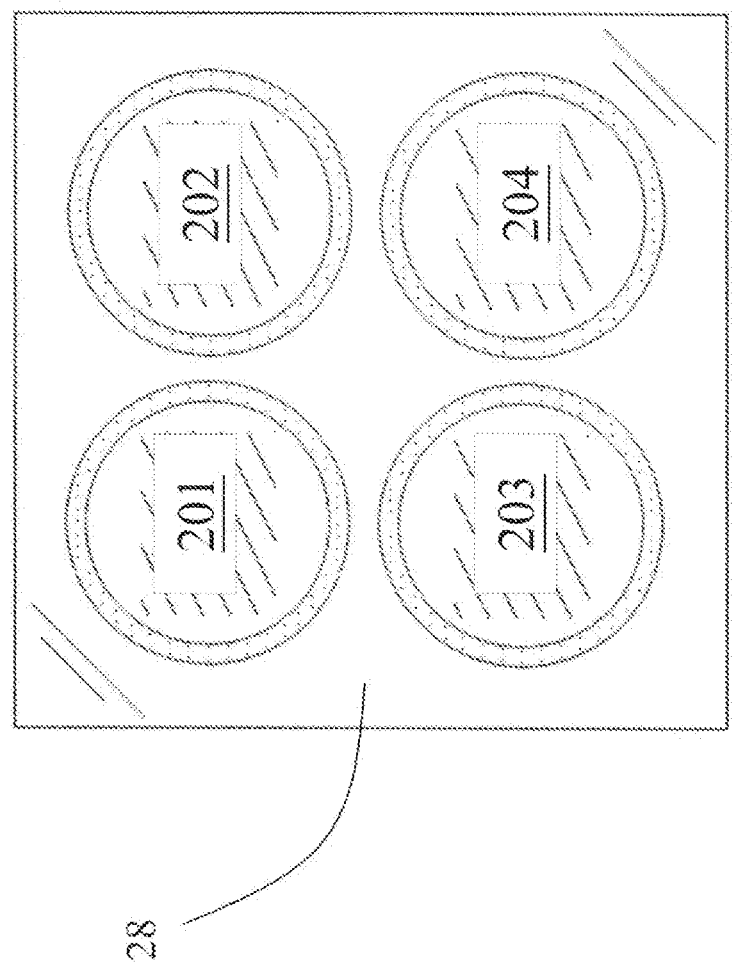
FIG. 11 shows a second embodiment according to the present invention.

FIG. 11 shows a second embodiment according to the present invention

The wafer reconfiguration according to the present invention also improves plating uniformity. FIG. 11 shows that the carrier 25 can be one of Copper Clad Laminate (CCL) or Alloy 42. The surface metal of the carrier functions as dummy circuitry 28 so that electric field can be evenly distributed to enhance the plating uniformity of the circuitry in the wafer during plating.

Figure 12:
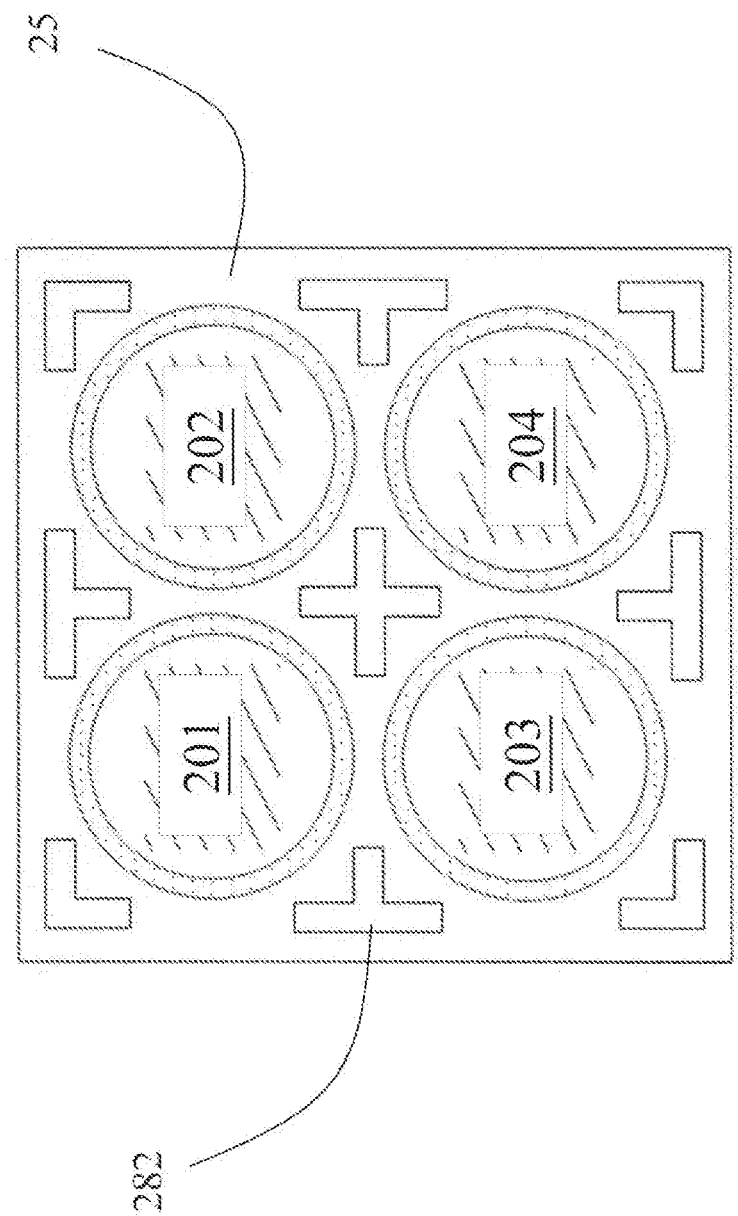
FIG. 12 shows a third embodiment according to the present invention.

FIG. 12 shows a third embodiment according to the present invention

FIG. 12 shows that carrier 25 is made of glass, then a dummy circuit 282 is formed on top of the glass carrier 25 so that electric field can be evenly distributed to enhance the plating uniformity of the circuitry in the wafer during plating.

FIGS. 13A~43B show wafer reconfiguration for a single wafer according to the present invention.

Figure 13A:
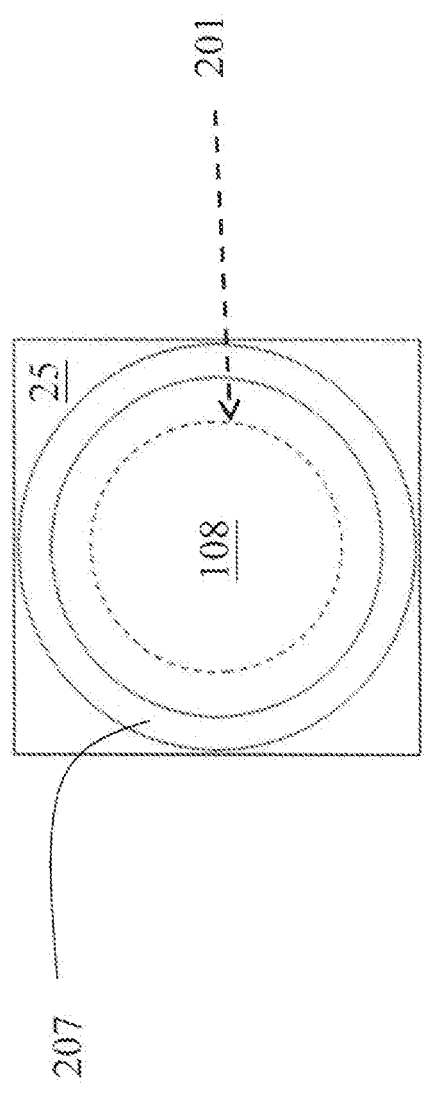
FIGS. 13A~13B show wafer reconfiguration for a single wafer according to the present invention.

FIG. 13A shows that a photoresist 108 is coated on top of the carrier 25 and a circular edge bead 207 formed at a peripheral area of the photoresist 108.

Figure 13B:
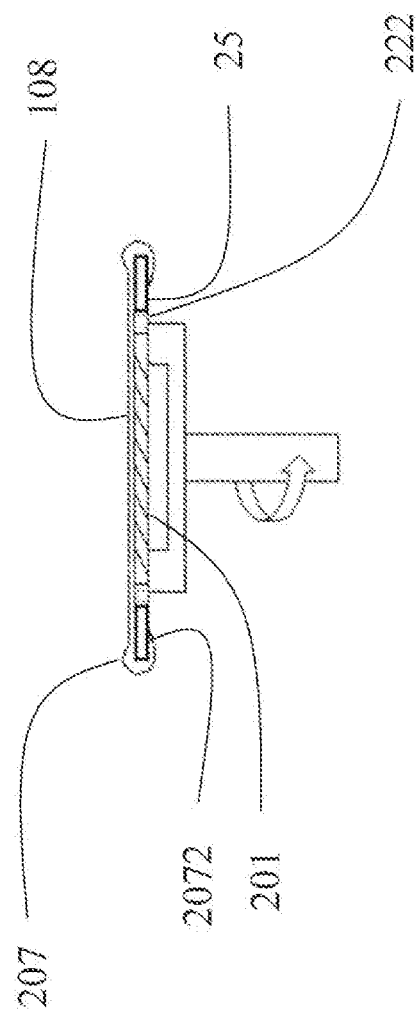

FIG. 13B shows a section view of FIG. 13A. A wafer 201 is embedded in a center of a carrier 25. A sealing material 222 fills the gap 22 between the wafer 201 and the carrier 25. A uniform photoresist 108 covers a larger area than the full top surface of the wafer 201. After EBR process, the full top surface of the wafer 201 can be active for the fabrication of chips.

Further, the photoresist wraps around the carrier 25, if any, contaminating the backside 2072 of the carrier 25 only, instead of contaminating the backside of the wafer 201.

According to the present invention, the wafer substrate can be made of silicon, glass, or aluminum. For which the Coefficient Thermal Expansion (CTE) is compatible with the CTE of the wafer substrate.

According to the present invention, the carrier 25 can be Copper Clad Laminate (CCL) or alloy 42 (NILO® 42 alloy). Alloy 42 is a nickel-iron controlled-expansion alloy containing 42% nickel. Alloy 42 has a low and normally constant coefficient of thermal expansion from room temperature to about 300° C. (570° F.). According to the present invention, the sealing material can be epoxy or silicone.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. A wafer reconfiguration during a coating process or an electric plating process, comprising:
   a carrier;
   at least one wafer received in a space in the carrier; and
   a sealing material filled in a gap between the wafer and the carrier,
   wherein each of the carrier, the wafer and the sealing material has, in a thickness direction of the wafer,
   a topmost surface, and
   a bottommost surface opposite to the topmost surface in the thickness direction,
   the topmost surface of the carrier, the topmost surface of the wafer, and the topmost surface of the sealing material are all coplanar with each other,
   the space extends, in the thickness direction of the wafer, through an entire thickness of the carrier from the topmost surface of the carrier to the bottommost surface of the carrier,
   the bottommost surface of the wafer is in direct contact with a topmost surface of a chuck, said topmost surface of the chuck supporting the wafer from below, wherein the bottommost surface of the carrier and the bottommost surface of the wafer are coplanar with the bottommost surface of the sealing material and, the topmost surface of the carrier comprises surface metal or dummy circuitry.

2. The wafer reconfiguration during the coating process or the electric plating process as claimed in claim 1, further comprising:
   a coating on top of the wafer reconfiguration,
   wherein said coating comprises a middle portion having a uniform thickness and covering an entirety of the topmost surface of the wafer.

3. The wafer reconfiguration during the coating process or the electric plating process as claimed in claim 2, wherein
   the coating further comprises an edge bead continuous to the middle portion, and
   the edge bead extends around the middle portion without overlapping the wafer in the thickness direction.

4. The wafer reconfiguration during the coating process or the electric plating process as claimed in claim 1, wherein the carrier is made of a material selected from the group consisting of Copper Clad Laminate and alloy 42.

5. The wafer reconfiguration during the coating process or the electric plating process as claimed in claim 1, wherein the sealing material is selected from the group consisting of epoxy and silicone.

6. The wafer reconfiguration during the coating process or the electric plating process as claimed in claim 1, wherein the wafer is made of a material selected from the group consisting of silicon, glass, and aluminum.

7. The wafer reconfiguration during the coating process or the electric plating process as claimed in claim 3, wherein
the middle portion having the uniform thickness covers an entirety of the topmost surface of the sealing material, and
a portion of the topmost surface of the carrier, and
the edge bead covers a remaining portion of the topmost surface of the carrier.

8. The wafer reconfiguration during the coating process or the electric plating process as claimed in claim 2, wherein
the middle portion having the uniform thickness covers an entirety of the topmost surface of the sealing material, and
a portion of the topmost surface of the carrier.

9. The wafer reconfiguration during the coating process or the electric plating process as claimed in claim 1, wherein
the sealing material extends around an outer periphery of the wafer, and
the canier extends around an outer periphery of the sealing material.

10. The wafer reconfiguration during the coating process or the electric plating process as claimed in claim 1, wherein the wafer is received in the space without the bottommost surface of the wafer being directly supported from below by any part of the carrier.

11. A wafer reconfiguration during a coating process or an electric plating process, comprising:
a carrier;
at least one semiconductor wafer received in a space in the carrier; and
a sealing material filled in a gap between the semiconductor wafer and the carrier,
wherein each of the carrier, the semiconductor wafer and the sealing material has, in a thickness direction of the semiconductor wafer,
a topmost surface, and
a bottommost surface opposite to the topmost surface in the thickness direction,
the topmost surface of the carrier, the topmost surface of the semiconductor wafer, and the topmost surface of the sealing material are all coplanar with each other,
the sealing material extends around an outer periphery of the semiconductor wafer,
the carrier extends around an outer periphery of the sealing material,
the bottommost surface of the wafer is in direct contact with a topmost surface of a chuck, said topmost surface of the chuck supporting the wafer from below, wherein
the bottommost surface of the carrier, the bottommost surface of the semiconductor wafer, and the bottommost surface of the sealing material are all coplanar with each other and, the topmost surface of the carrier comprises surface metal or dummy circuitry.

12. The wafer reconfiguration during the coating process or the electric plating process as claimed in claim 11, wherein
the carrier is made of a material selected from the group consisting of Copper Clad Laminate and alloy 42, and
the sealing material is selected from the group consisting of epoxy and silicone.

13. The wafer reconfiguration during the coating process or the electric plating process as claimed in claim 11, further comprising:
a spin-coated material layer on top of the wafer reconfiguration,
wherein said spin-coated material layer comprises a middle portion having a uniform thickness and covering an entirety of the topmost surface of the semiconductor wafer.

14. The wafer reconfiguration during the coating process or the electric plating process as claimed in claim 13, wherein
the spin-coated material layer further comprises an edge bead continuous to the middle portion, and
the edge bead extends around the middle portion without overlapping the semiconductor wafer in the thickness direction.

15. The wafer reconfiguration during the coating process or the electric plating process as claimed in claim 14, wherein
the middle portion having the uniform thickness covers an entirety of the topmost surface of the sealing material, and
a portion of the topmost surface of the carrier, and
the edge bead covers a remaining portion of the topmost surface of the carrier.

16. The wafer reconfiguration during the coating process or the electric plating process as claimed in claim 13, wherein
the middle portion having the uniform thickness covers an entirety of the topmost surface of the sealing material, and
a portion of the topmost surface of the carrier.

17. The wafer reconfiguration during the coating process or the electric plating process as claimed in claim 11, wherein the space extends, in the thickness direction of the wafer, through an entire thickness of the carrier from the topmost surface of the carrier to the bottommost surface of the carrier.

* * * * *